United States Patent [19]
Kikuchi

[11] Patent Number: 4,721,207
[45] Date of Patent: Jan. 26, 1988

[54] HARD DISK CONTAINER

[75] Inventor: Shoji Kikuchi, Tokyo, Japan

[73] Assignee: Tensho Electric Industrial Co., Ltd., Tokyo, Japan

[21] Appl. No.: 856,213

[22] Filed: Apr. 28, 1986

[51] Int. Cl.⁴ .................................... B65D 85/48
[52] U.S. Cl. ............................ 206/334; 206/204; 206/328; 206/444; 206/454
[58] Field of Search ............ 206/204, 303, 309, 316, 206/334, 444, 454, 459, 311, 312, 328; 211/41

[56] References Cited

U.S. PATENT DOCUMENTS

| | | | |
|---|---|---|---|
| 3,156,402 | 11/1964 | DuPuis | 206/204 |
| 3,776,410 | 12/1973 | Carlson | 206/459 |
| 3,833,406 | 9/1974 | White | 206/204 |
| 3,854,581 | 12/1974 | Jones, Jr. | 206/459 |
| 3,923,156 | 12/1975 | Wallestad | 206/454 |
| 4,043,451 | 8/1977 | Johnson | 206/334 |
| 4,061,228 | 12/1977 | Johnson | 206/454 |
| 4,213,528 | 7/1980 | Kreutz et al. | 206/204 |
| 4,248,346 | 2/1981 | Johnson | 206/334 |
| 4,276,989 | 7/1981 | Hicks | 215/270 |
| 4,327,830 | 5/1982 | Patel et al. | 206/312 |
| 4,443,874 | 4/1984 | Steenberg | 206/312 |
| 4,490,087 | 12/1984 | Ryan et al. | 206/454 |
| 4,519,501 | 5/1985 | Cerwin | 206/204 |
| 4,520,925 | 6/1985 | Johnson | 206/334 |
| 4,555,024 | 11/1985 | Voss et al. | 206/334 |
| 4,557,382 | 12/1985 | Johnson | 206/444 |
| 4,574,950 | 3/1986 | Koe et al. | 206/334 |

*Primary Examiner*—Stephen Marcus
*Assistant Examiner*—David T. Fidei
*Attorney, Agent, or Firm*—Wenderoth, Lind & Ponack

[57] ABSTRACT

An improved hard disk container of the type having a container body with U-shaped disk receiving grooves therein and covers over upper and end openings in opposite ends and over a lower opening. Continuous upper and end protrusions are integrally mounted adjacent the upper opening and on the ends adjacent the end openings, and a continuous lower protrusion is integrally mounted around the lower opening. The lower face of the upper cover has continuous upper and end grooves therein in which the continuous upper and end protrusions are engaged. A continuous sealing upper projection is integrally provided on the wall of the continuous upper and end grooves and the upper and end protrusions have a continuous sealing recess therein in which the continuous upper projection is resiliently sealingly engaged. The lower cover has a continuous lower groove around the upper surface in which the continuous lower protrusion is engaged, and a continuous sealing lower projection is integrally provided on the wall of the lower groove, the continuous lower protrusion having a continuous sealing recess therein in which the continuous lower sealing projection is resiliently sealingly engaged. Pairs of brackets are detachably mounted on the upper cover and project into the disk receiving grooves for resiliently engaging hard disks in the container body so as to position the hard disks in the disk receiving grooves. Humidity absorbing material is provided in the container body for absorbing humidity.

6 Claims, 6 Drawing Figures

HARD DISK CONTAINER

BACKGROUND OF THE INVENTION

This invention relates to a container for containing and transporting hard disks which function as magnetic storage medium for a storage device of a computer. The container may be used for a carrier for processing the disks.

As shown in FIGS. 5 and 6, a prior hard disk container 1 comprises a container body 2 in the form of a rack carrier having a plurality of U-shaped disk receiving grooves 3 provided in an inner surface of the container body 2 in a spaced manner and in which magnetic hard disks (not shown) are engaged, respectively, and having end openings 4 provided in both ends of the container body 2 to expose central holes of the hard disks therethrough for inserting a tool therethrough and upper and lower openings provided in upper and lower portions of the container body 2. An upper cover 5 is mounted on the container body 2 at its upper portion to close the upper opening and the end openings 4 and has a positioning protrusion 5a on the upper face of the upper cover 5. Also, a lower cover 6 is mounted on the container body 2 at its lower portion to close the lower opening and has a positioning recess 6a to receive a positioning protrusion 5a on an upper cover 5 of a container therebelow as as to permit stacking the hard disk containers upon the other. The upper and lower covers 5 and 6 are loosely mounted on the container body 2.

Although the hard disk container 1 may be discarded after being used only one time or reused after a full cleaning and refurbishing process, it tends to be reused because hard disks have rapidly become cheaper in the same manner as semiconductors. Thus, it will be noted that the hard disk container is required to have durability if it is to be reused.

However, the prior hard disk container has the following various drawbacks. One of them is that the prior container has no air-tightness because the upper and lower covers 5 and 6 are loosely mounted on the container body 2 as aforementioned. Thus, the container breathes due to variation in ambient temperature to cause it to inhale humidity and/or dust to contaminate surfaces of the hard disks which have a mirror-like finish, which probably causes them to vary in physical properties. This causes the hard disks to be ineffectively reproduced and to have little durability.

Another drawback is that the hard disks loosely engage the grooves 3 in the container body 2 because the grooves 3 are formed so wide as to allow the hard disks to be introduced easily into and/or be easily withdrawn out of the sliding grooves 3. Although the upper cover 5 has bracket 5b provided thereon so as to position the hard disks in the sliding grooves 3, it is difficult to engage the brackets with the hard disks because they loosely engage the sliding grooves 3. Thus, the hard disks tend to be contained in the container body 2 in a slightly inclined manner so that they distort the brackets, which causes the durability of the container to be shortened.

A further drawback is that since the upper and lower covers 5 and 6 are frequently removed from the container body 2, it is difficult to mount them on the corresponding container body 2. More particularly, the hard disk container is so conditioned that the upper and lower covers 5 and 6 are removed from the container body 2 when processing the hard disks and are in place only during their transportation and storage. Thus, the container body 2 and the upper and lower covers 5 and 6 are seldom combined with each other after two uses although they are combined at the beginning of use. Since the times of processing use of the container body 2 are different from the times of use of the upper and lower covers 5 and 6, the covers cannot be mounted on the former in an air-tight manner. In order to avoid this problem, an operator should always match the lot numbers indicated on the container body 2 and the covers 5 and 6 of the containers. However, it is troublesome and in addition has low accuracy of because the operator matches them with his eyes.

SUMMARY OF THE INVENTION

Accordingly, it is a principal object of the invention to provide a hard disk container adapted to positively contain hard disks in precise positions.

Another object of the invention is to provide a hard disk container adapted to maintain high airtightness so as to prevent hard disks from being contaminated.

A further object of the invention is to provide a hard disk container adapted to make the combination of a container body and proper upper and lower covers accurate.

In accordance with the present invention, there is provided a hard disk container comprising a container body having a plurality of U-shaped sliding grooves provided in an inner surface thereof in a spaced manner to receive magnetic hard disks, respectively and having end openings provided in both ends thereof to expose central holes of said hard disks therethrough and upper and lower openings provided in upper and lower portions of said container body, an upper cover mounted on said container body at its uper portion to close said upper opening and said side openings and having a positioning protrusion on the upper face of said upper cover, and a lower cover mounted on said container body at its lower portion to close said lower opening and having a positioning recess to engage a positioning protrusion of an upper cover on a next lower container, so as to make it possible to superpose one of said hard disk containers upon the other, characterized by;

said upper cover having continuous upper and side grooves engaging continuous upper and side protrusions integrally provided on said container body at its upper portion and at its portions adjacent to said side opeings and a sealing upper projection integrally provided on the wall of said continuous upper groove to resiliently engage a sealing recess in the wall of said continuous upper protrusion of said container body;

said lower cover having a continuous lower groove engaging a continuous lower protrusion integrally provided on said container body at its lower portion and a sealing lower projection integrally provided on the wall of said continuous lower groove to resiliently engage a sealing lower recess in the wall of said continuous lower protrusion of said container body;

said upper cover also having a plurality of pairs of brackets detachably provided therein to resiliently engage said hard disks in said container body so as to position said hard disks in the sliding grooves;

and further comprising humidity absorbing means provided in at least one of said container body and said upper and lower covers to absorb humidity in said hard disk container.

BRIEF DESCRIPTION OF THE DRAWINGS

The above and other objects and features of the invention will be apparent from the description of the embodiment taken with reference to the accompanying drawings in which.

DETAILED DESCRIPTION OF THE EMBODIMENT

Figure 1:
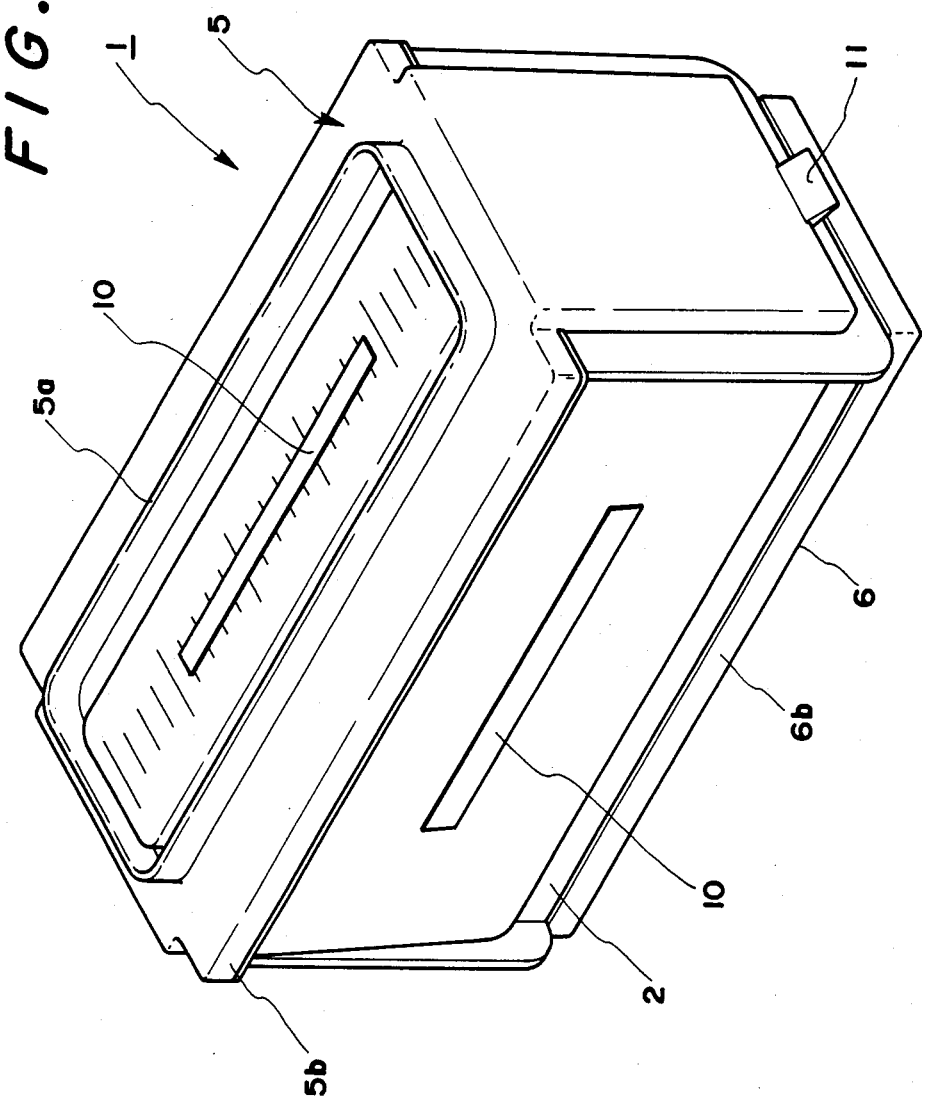
FIG. 1 is a perspective view of a hard disk container constructed in accordance with one embodiment of the invention.
Figure 2:
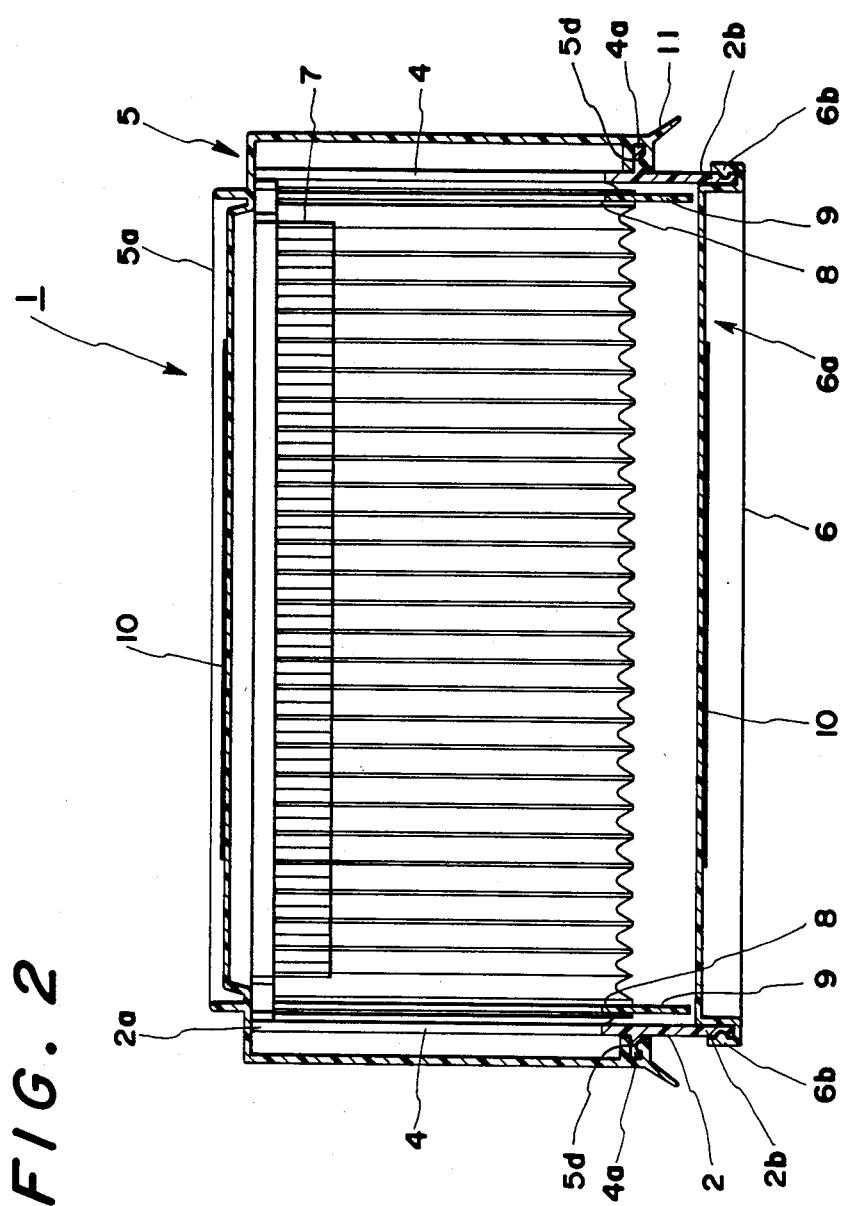
FIG. 2 is a longitudinal sectional view of the hard disk container of FIG. 1.
Figure 3:
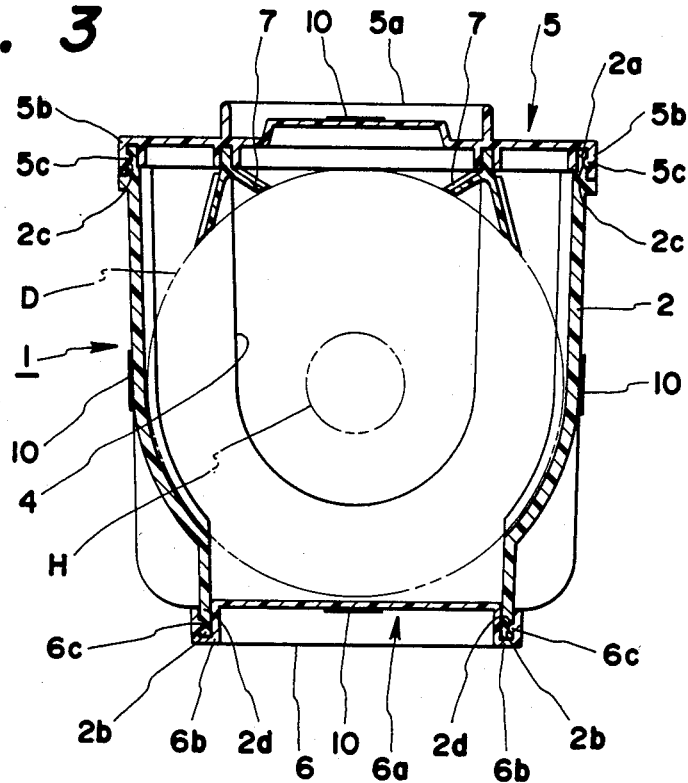
FIG. 3 is a cross sectional view of the hard disk container of FIG. 1.

Referring to FIGS. 1 through 3, there is shown a hard disk container 1 constructed in accordance with one embodiment of the invention. The hard disk container 1 comprises a container body 2 having a plurality of U-shaped disk receiving grooves 3 provided in an inner surface thereof in a spaced manner and receiving magnetic hard disks D, respectively, and having end openings 4 provided in both ends thereof to expose central holes H of the hard disks D therethrough so as to make it possible to insert a handling tool, not shown, and upper and lower openings provided in upper and lower portions of the container body 2 of the hard disk container 1. As shown in FIG. 2 and FIG. 3, the container body 2 has continuous upper and side sealing protrusions 2a and 4a integrally provided on the container body 2 at its upper portion and at the portion adjacent to the side openings 4 and a successive lower sealing protrusion 2b integrally provided on the container body 2 at the portion adjacent to its lower opening. The sealing upper and lower protrusions 2a and 2b have sealing upper and lower recesses 2c and 2d provided in the walls of the upper and lower protrusions 2a and 2b at their peripheries to sealingly engage sealing upper and lower projections in upper and lower covers described hereinbelow.

An upper cover 5 is sealingly mounted on the container body 2 at its upper portion to close the upper opening and the side openings 4 and has a positioning protrusion 5a on the upper face thereof. A lower cover 6 is sealingly mounted on the container body 2 at its lower portion to close the lower opening and has a positioning recess 6a to engage the positioning protrusion 5a of an upper cover 5 of a next lower container to make it possible to superpose one of the hard disk containers 1 upon the other. The upper and lower covers 5 and 6 have continuous upper and lower grooves 5b and 6b provided at their peripheries to engage the sealing upper and lower protrusion 2a and 2b of the container body 2. The upper cover 5 also has continuous side grooves 5d provided in the portion adjacent to the cover portion covering the side openings 4 to engage the sealing side protrusion 4a of the container body 2. The upper and lower covers 5 and 6 also have sealing upper and lower projections 5c and 6c to sealingly engage the sealing upper and lower recesses 2c and 2d, respectively so as to mount the upper and lower covers 5 and 6 on the container body 2 in an airtight manner.

The upper cover 5 also has a plurality of pairs of inverted Y-shaped brackets 7 detachably provided therein to resiliently engage the hard disks D in the container body 2 so as to position the hard disks D in the sliding grooves 3.

Figure 4:
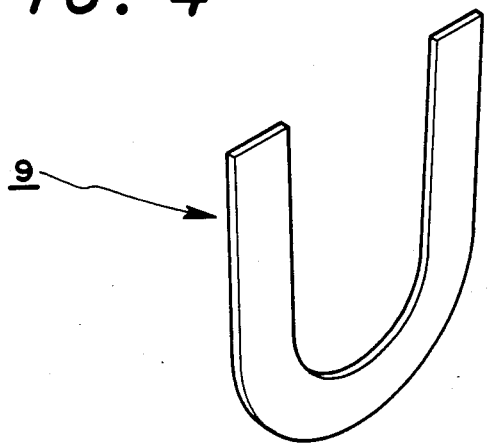
FIG. 4 is an enlarged perspective view of humidity absorbing pannel used for the hard disk container of FIG. 1.
Figure 5:
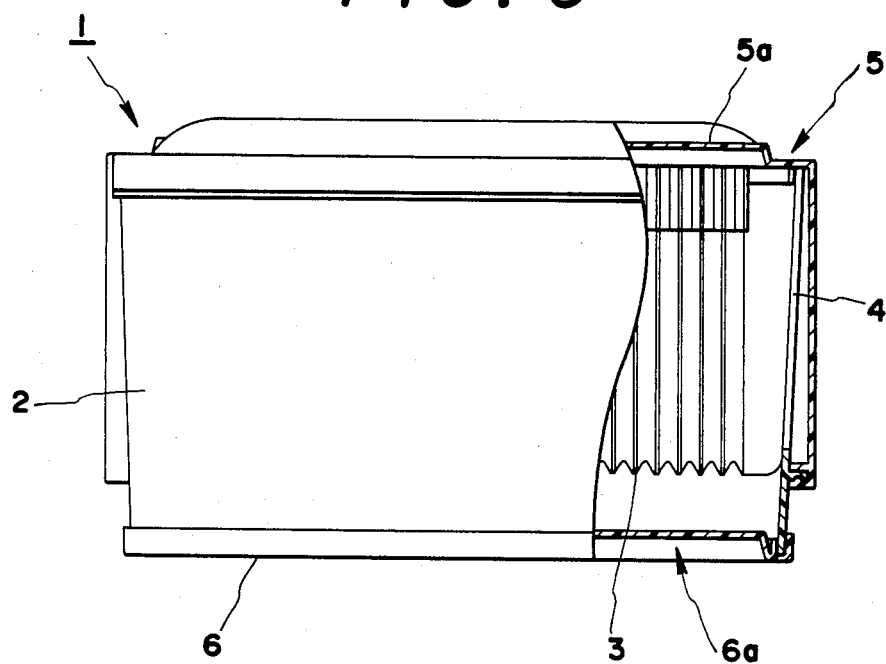
FIG. 5 is a side elevational view of a prior hard disk container with a portion cut away.
Figure 6:
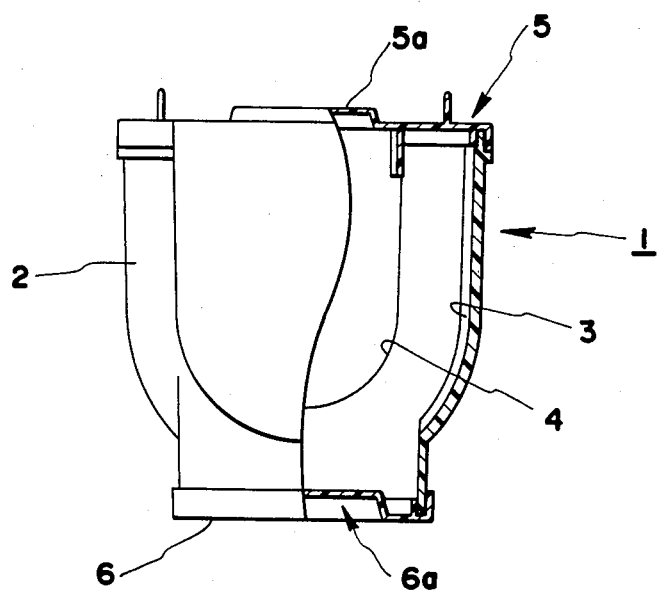
FIG. 6 is an end elevational view of the prior hard disk container of FIG. 5 with a portion cut away.

Humidity absorbing means is provided in one of the container body 2 and the upper and lower covers 5 and 6 to abosrb humidity in the hard disk container 1. In the illustrated embodiment, the humidity absorbing means may comprise a U-shaped humidity absorbing pannel 9 including a humidity absorbing agent such as silica gel coated on a base as shown in FIG. 4, which is introduced into a groove 8 provided in the container body 2 separately from, but similarly to the grooves 3. The humidity absorbing agent may be coated on the inner surface of at least one of the container body 2 and the upper and lower covers 5 and 6.

A magnetic layer 10 may be provided on the outer surfaces of the container body 2 and the upper and lower covers 5 and 6 to provide the history of process of the container and of its transportation and a protective film of chemical resistance material may be coated on the magnetic layer 10 to protect it.

A flange 11 may be provided on the upper cover 5 to help to remove the upper cover 5 from the container body 2 by the operator's finger.

As aforementioned, since the the upper and lower covers 5 and 6 at their successive upper, side and lower grooves 5b, 5d and 6b engage the sealing upper, side and lower protrusions 2a and 2b of the container body 2 while the sealing projections 5c and 6c on the walls of the successive upper and lower grooves 5b and 6b of the upper and lower covers 5 and 6 engage the sealing upper and lower recesses 2c and 2d in the walls of the sealing upper and lower protrusions 2a and 2b of the container body 2, the upper and lower covers 5 and 6 are mounted on the container body 2 in an air-tight manner and they are never unintentionally removed from the container body 2. Also, since the humidity absorbing agent is provided within the hard disk container in the form of pannel or in the form of film on the inner face of at least one of the container body 2 and the upper and lower covers 5 and 6, humidity within the hard disk container 1 can be positively removed while the humidity absorbing agent does not interfere with an automatic machine if the hard disk container is used therein.

Furthermore, since a plurality of pairs of brackets 7 in the form of inverted Y-shape are used on the upper cover 5 so that they resiliently engage the hard disks D within the container1, they can positively hold the hard disks D by mounting the upper cover 5 on the container body 2 after the brackets 7 engage the hard disks D. The magnetic film 10 on the outer surfaces of the container body 2 and the upper and lower covers 5 and 6 serves to make it easy for the operator to know the history of the process of the container and its transportation while it is protected by the protective film on the magnetic film 10. Thus, it will be noted that the container can cope with severe management conditions and that even though the container body 2 and the covers 5 and 6 having substantial difference between the times of their use are combined with each other, it never causes any trouble with the combination.

While an embodiment of the invention has been described and illustrated with reference to the accompanying drawings, it will be understood by those skilled in the art that it is by way of example, and that various changes and modifications may be made without departing from the spirit and scope of the invention, which is intended to be defined only by the appended claims.

What is claimed is:

1. A hard disk container comprising:
   a container body having a plurality of spaced parallel U-shaped disk receiving grooves provided in an inner surface thereof and having end openings provided in opposite ends thereof to expose central holes of the hard disks therethrough and having upper and lower openings provided in upper and lower portions thereof;
   continuous upper and end protrusions integrally mounted on said container body on the upper portion adjacent said upper opening and on the ends adjacent to said end openings, and a continuous lower protrustion integrally mounted on said container around said lower opening;
   an upper cover removably mounted on the upper portion and over the ends of said container body for closing said upper opening and said end openings;
   a positioning protrusion on the upper face of said upper cover;
   the lower face of said upper cover having continuous upper and end grooves therein in which said continuous upper and end protrusions are engaged;
   a continuous sealing upper projection integrally provided on the wall of said continuous upper and end grooves, said continuous upper and end protrusions having a continuous sealing recess therein in which said continuous upper projection is resiliently sealingly engaged;
   a lower cover removably mounted on the lower portion of said container body for closing said lower opening and having a positioning recess in the lower surface thereof in which a positioning protrusion on a next lower container can engage for permitting the containers to be stacked on each other;
   said lower cover having a continuous lower groove around the upper surface thereof in which said continuous lower protrusion is engaged;
   a continuous sealing lower projection integrally provided on the wall of said continuous lower groove, said continuous lower protrusion having a continuous sealing recess therein in which said continuous sealing projection is resiliently sealingly engaged;
   a plurality of pairs of brackets detachably mounted on said upper cover and projecting into said disk receiving grooves for resiliently engaging hard disks in said container body so as to position the hard disks in the disk receiving grooves; and
   humidity absorbing means provided in at least one of said container body and said upper and lower covers for absorbing humidity from the inside of said disk container.

2. A hard disk container as set forth in claim 1, wherein said brackets have an inverted Y-shape, with a stem depending from said upper cover and two diverging arms for engaging peripherally spaced points on a hard disk.

3. A hard disk container as set forth in claim 1, and further comprising history indicating means provided in at least one of said container body and said upper and lower covers and constituted by a magnetic film on the outer face of said at least one of the container body and said upper and lower covers, and a protective film having chemical resistance provided on said magnetic film, said film containing the history of the use of said container and of its transportation.

4. A hard disk container as claimed in claim 1, wherein said humidity absorbing means comprises a humidity absorbing member including humidity absorbing agent coated on a base and is provided on the inner surface of at least one of said container body and said upper and lower covers.

5. A hard disk container as set forth in claim 4, wherein said humidity absorbing member is in the form of panel having the same configuration as said hard disk and is contained in said container body and engages a groove in said container body.

6. A hard disk container as set forth in claim 4, wherein said humidity absorbing agent is formed of silica gel.

* * * * *